United States Patent
Koob et al.

(10) Patent No.: US 8,719,503 B2
(45) Date of Patent: May 6, 2014

(54) CONFIGURABLE CACHE AND METHOD TO CONFIGURE SAME

(75) Inventors: Christopher Edward Koob, Round Rock, TX (US); Ajay Anant Ingle, Austin, TX (US); Lucian Codrescu, Austin, TX (US); Jian Shen, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 11 days.

(21) Appl. No.: 13/531,803

(22) Filed: Jun. 25, 2012

(65) Prior Publication Data

US 2012/0265943 A1 Oct. 18, 2012

Related U.S. Application Data

(62) Division of application No. 12/397,185, filed on Mar. 3, 2009, now Pat. No. 8,266,409.

(51) Int. Cl.
| | |
|---|---|
| *G06F 12/00* | (2006.01) |
| *G06F 13/00* | (2006.01) |
| *G06F 13/28* | (2006.01) |
| *G06F 9/26* | (2006.01) |
| *G06F 9/34* | (2006.01) |

(52) U.S. Cl.
USPC ............ 711/118; 711/172; 711/202; 711/212

(58) Field of Classification Search
USPC ................................. 711/118, 172, 202, 212
See application file for complete search history.

(56) References Cited

U.S. PATENT DOCUMENTS

| 4,315,312 A | 2/1982 | Schmidt |
|---|---|---|
| 5,257,360 A | 10/1993 | Schnizlein et al. |

(Continued)

FOREIGN PATENT DOCUMENTS

| CN | 101334759 A | 12/2008 |
|---|---|---|
| JP | 2006510992 A | 3/2006 |

(Continued)

OTHER PUBLICATIONS

Chuanjun Zhang, Frank Vahid, Walid Najjar, "A Highly Configurable Cache Architecture for Embedded Systems," 30th Annual International Symposium on Computer Architecture (ISCA'03), 2003.

(Continued)

*Primary Examiner* — Ryan Bertram
(74) *Attorney, Agent, or Firm* — Peter Michael Kamarchik; Nicholas J. Pauley; Joseph Agusta

(57) ABSTRACT

A method includes receiving an address at a tag state array of a cache. The cache is configurable to have a first size or a second size that is larger than the first size. The method includes identifying a first portion of the address as a set index and using the set index to locate at least one tag field of the tag state array. The method also includes identifying a second portion of the address to compare to a value stored at the at least one tag field and locating at least one state field of the tag state array associated with a particular tag field that matches the second portion. The method further includes identifying a cache line based on a comparison of a third portion of the address to at least two status bits of the at least one state field and retrieving the cache line.

20 Claims, 9 Drawing Sheets

(56) References Cited

U.S. PATENT DOCUMENTS

| | | |
|---|---|---|
| 5,586,303 A | 12/1996 | Willenz et al. |
| 5,721,874 A | 2/1998 | Carnevale et al. |
| 5,857,214 A | 1/1999 | Dey |
| 6,865,646 B2 | 3/2005 | David |
| 7,133,997 B2 | 11/2006 | Singh |
| 2004/0260879 A1 | 12/2004 | Barroso et al. |
| 2005/0080994 A1* | 4/2005 | Cohen et al. ............ 711/118 |
| 2005/0270876 A1 | 12/2005 | Blanco et al. |
| 2006/0277365 A1 | 12/2006 | Pong |
| 2007/0005895 A1 | 1/2007 | Fujisaki et al. |
| 2009/0006754 A1 | 1/2009 | Luick |
| 2010/0228941 A1 | 9/2010 | Koob et al. |

FOREIGN PATENT DOCUMENTS

| | | |
|---|---|---|
| KR | 20050088292 A | 9/2005 |
| TW | I292557 B | 1/2008 |
| TW | 200821906 A | 5/2008 |
| WO | 2004061675 A1 | 7/2004 |

OTHER PUBLICATIONS

International Search Report & Written Opinion—PCT/US2010/026106, International Search Authority—European Patent Office, May 31, 2010.

Tanenbaum Andrew, "Structured Computer Organization", Prentice-Hall, 1984.

Taiwan Search Report—TW099106221—TIPO—May 6, 2013.

\* cited by examiner

CONFIGURABLE CACHE AND METHOD TO CONFIGURE SAME

I. CLAIM OF PRIORITY

This application claims priority from and is a divisional application of U.S. patent application Ser. No. 12/397,185, filed Mar. 3, 2009, entitled "CONFIGURABLE CACHE AND METHOD TO CONFIGURE SAME," the contents of which are incorporated by reference in its entirety.

II. FIELD OF THE DISCLOSURE

The present disclosure is generally directed to a configurable cache and method to configure same.

III. BACKGROUND

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, wireless telephones can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Digital signal processors (DSPs), image processors, and other processing devices are frequently used in portable personal computing devices and operate in conjunction with one or more caches. A cache is usually a copy of data that exists somewhere in a memory hierarchy. In some cases, the cache may have the only "up to date" copy of the data in the system. One typical component of a cache is a data memory. This data memory is divided into cache lines, where each cache line is a copy of a unique (and contiguous) part of the system memory. Another typical component of a cache is a way to associate a system memory address with a particular cache line.

This way to associate a system memory address with a particular cache line is often called a tag. Another typical component of a cache is a state to indicate whether a cache line is valid, modified, owned, and the like.

IV. SUMMARY

A configurable cache may be resized by modifying a cache line size without changing a number of tags of the cache. Mapping between different cache sizes may be performed by shifting a location of an index within a memory address for a cache lookup. As an example, a pair of multiplexers may select address bits based on the size of the cache to shift the location of the index during a lookup operation.

In a particular embodiment, an apparatus is disclosed that includes a cache having a tag state array. The tag state array includes a tag area addressable by a set index. The tag state array also includes a state area addressable by a state address, where the set index and the state address include at least one common bit.

In another embodiment, a method is disclosed that includes receiving an address at a tag state array of a cache, where the cache is configurable to have one of a first size and a second size that is larger than the first size. The method also includes identifying a first portion of the address as a set index, using the set index to locate at least one tag field of the tag array, and identifying a second portion of the address to compare to a value stored at the at least one tag field. The method further includes locating at least one state field of the tag state array that is associated with a particular tag field that matches the second portion and identifying a cache line based on a comparison of a third portion of the address to at least two status bits of the at least one state field. The method also includes retrieving the cache line, where a first location of the first portion of the address and a second location of the second portion of the address are selected based on whether the cache is configured to have the first size or the second size, and where the first portion of the address has a same number of bits when the cache has the first size as when the cache has the second size.

in another embodiment, a method is disclosed that includes changing a size of a cache. The method also includes shifting a location of a set index portion of an address of data to be retrieved from the cache in response to changing the size of the cache, where a bit length of the set index portion is not changed when the location is shifted.

In another embodiment, a computer-readable medium is disclosed. The computer-readable medium tangibly embodies computer executable instructions that are executable to cause a computer to change a cache from a first configuration having a first data area size to a second configuration having a second data area size, by increasing an amount of data associated with each entry of a data array of the cache and maintaining a first number of entries of the data array that are addressable via a set index, and by maintaining a second number of entries of the data array associated with each value of the set index. The computer executable instructions are further executable to cause the computer to shift a range of bits of a memory address to index a tag state array that is associated with the data array, where the range of bits to index the tag state array is shifted based on changing the cache from the first configuration to the second configuration.

One particular advantage provided by disclosed embodiments is that configurable mapping between tags and cache lines is provided to support greater tag utilization for multiple data RAM configurations, so that as the data RAM is configured to be 100% cache, 50% cache, or 25% cache, the cache line size is reduced by an equivalent amount.

Another advantage provided by disclosed embodiments is that the number of tags available is substantially maximized, in a cost and timing effective way, as the data RAM available for caching is reduced, which is of particular importance in a low-powered multi-threaded processor environment where traditional data locality assumptions may not hold. The cache with more tags is a higher performing cache, since address space conflicts are reduced.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
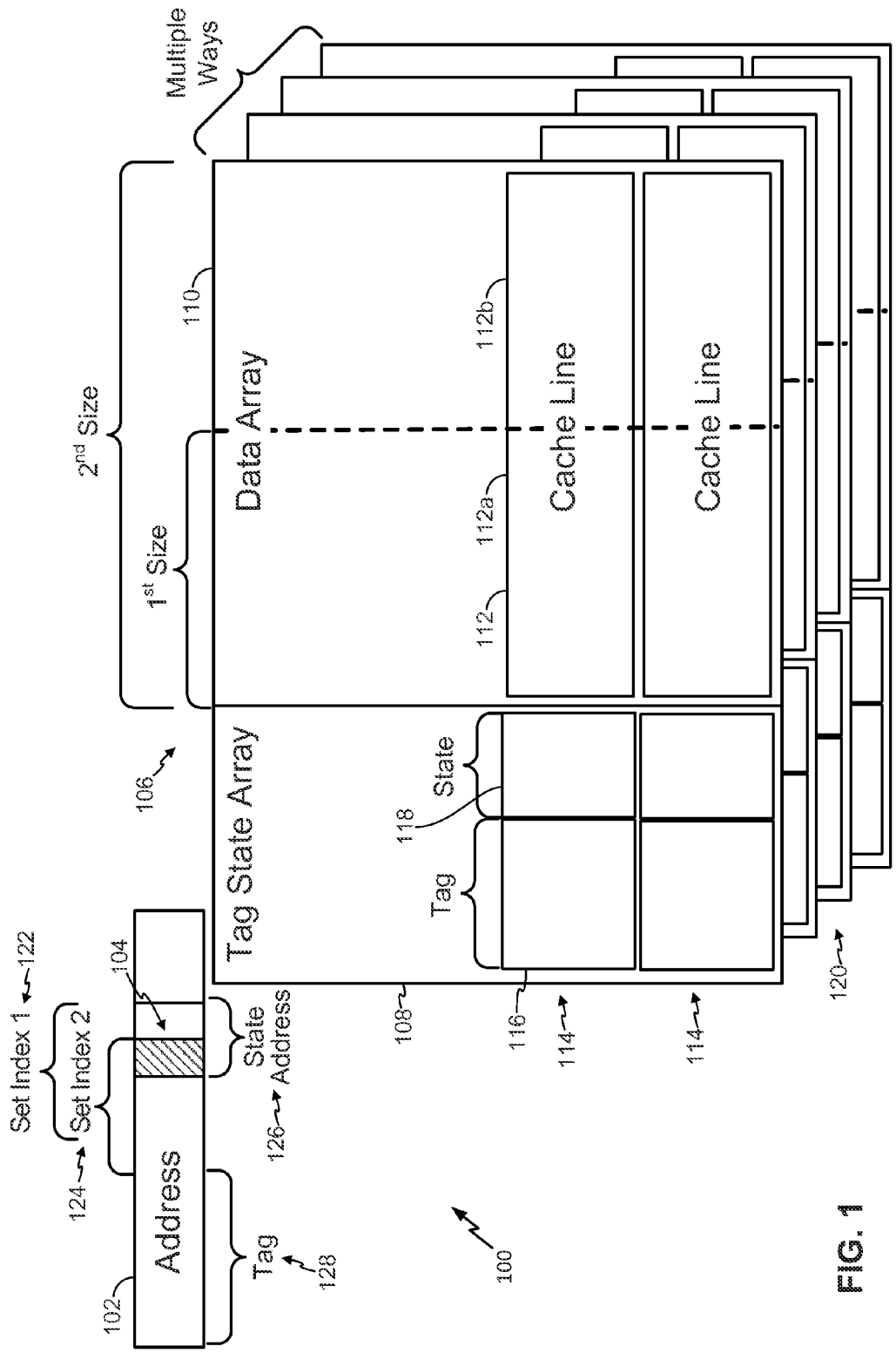
FIG. 1 is a block diagram of a particular illustrative embodiment of a configurable cache system having a tag state array, multiple ways, and a cache data area coupled to the tag state array.

Referring to FIG. 1, a particular illustrative embodiment of a configurable cache system 100 having a tag state array 108, multiple ways 120, and a cache data area 110 coupled to the tag state array 108 is illustrated. The configurable cache system 100 includes a configurable cache 106 and an address 102. The configurable cache 106 includes the tag state array 108 coupled to the cache data area 110. The cache data area 110 includes one or more cache lines 112. The cache data area 110 is configurable to have a first cache size corresponding to a first cache configuration or to have a second cache size corresponding to a second cache configuration, where the second cache size is larger than the first cache size, as shown in FIG. 1. The cache data area 110 includes the multiple ways 120 associated with each value of a set index, such as set index 1 122 or set index 2 124. The multiple ways 120 enable the cache data area 110 to store multiple data values for each set index value. The cache data area 110 has the same number of ways 120 in the first cache configuration and in the second cache configuration, as shown in FIG. 1.

The tag state array 108 includes a to area 116 addressable by the set index, such as the set index 1 122 or the set index 2 124 shown associated with the address 102. The tag state array 108 also includes a state area 118 addressable by a state address 126. Each of the cache lines 112 is associated with a tag address 128. As shown in FIG. 1, the set index 2 124 and the state address 126 include at least one common bit 104, such as a common address bit. The set index 1 122 and the state address 126 include at least two common bits 104, such as two common address bits. In a particular embodiment, the number of common bits 104, such as common address bits, between the set index 122, 124 and the state address 126 varies depending on the size of the configurable cache 106. In a particular embodiment, the state address 126 and the set index 1 122 include two common bits 104 in a first configuration and the state address 126 and the set index 2 124 include one common bit 104 in a second configuration. The tag state array 108 also includes one or more sets 114. In a particular embodiment, the tag state array 108 has the same size of a set 114 in the first cache configuration and in the second cache configuration.

As shown in FIG. 1, each of the cache lines 112 includes one or more segments or sectors 112a, 112b. When the cache data area 110 has the first cache size, each of the cache lines 112 includes one segment or sector 112a. When the cache data area 110 has the second cache size, each of the cache lines 112 includes two segments or sectors 112a, 112b. In a particular embodiment, the cache data area 110 may have the same cache line segment size in the first cache configuration and in the second cache configuration. In an alternative embodiment, the cache data area 110 has a predetermined number of rows that are addressable by the set index 122, 124. The cache data area 110 may be configured to store at least a first number of cache lines 112 associated with each row in a first configuration and a second number of cache lines 112 associated with each row in a second configuration, where the second number of cache lines 112 is larger than the first number of cache lines 112.

There may be a relationship between the cache line size, data memory size, and the number of tags. This relationship may be expressed by the formula:

$$\text{number of tags} = \frac{\text{data memory size}}{\text{cache line size}}.$$

From this formula, it can be seen that increasing the cache line size while keeping the data memory size constant may decrease the number of tags. Decreasing the number of tags may require less physical storage, however, decreasing the number of tags implies fewer unique memory locations (or ranges) may be contained in the cache. As an extreme example, consider a 32 byte cache that only has a single tag. All 32 bytes would be a copy of a contiguous part of system memory. By contrast, if the cache had 8 tags, 8 unrelated 4 byte regions could be contained in the cache. By extension, a single 32 byte contiguous region could also be stored in such a cache.

In some cases, the data memory portion of a cache may not be constant, but may be configurable, as in the configurable cache system 100 of FIG. 1, where a portion may be reserved for cache and another portion may be reserved for tightly coupled memory (TCM). In one arrangement, a cache may have a fixed cache line size and a fixed mapping between tags and cache lines. However, if the size of such a cache is reduced, the number of cache lines and the number of tags are reduced by this amount. For example, in an L2 cache where the data random access memories (RAMs) are organized into 4 banks, with each bank having its own set of tags, if the data RAM is configured as 50% cache and 50% TCM, then the tags in the TCM are no longer available to the cache.

By adjusting the cache line size together with the data memory size, the configurable cache system 100 of FIG. 1 enables the number of tags to remain substantially the same. As a result, a configurable mapping between tags and cache lines is provided to support eater tag utilization for multiple data RAM configurations, so that as the data RAM is configured to be 100% cache, 50% cache, or 25% cache, the cache line size is reduced by an equivalent amount. In addition, the number of tags available is substantially maximized, in a cost and timing effective way, as the data RAM available for caching is reduced. This may be of particular importance in a low-powered multi-threaded processor environment where traditional data locality assumptions may not hold. The cache with more tags may be a higher performing cache, since address space conflicts are reduced.

Figure 2:
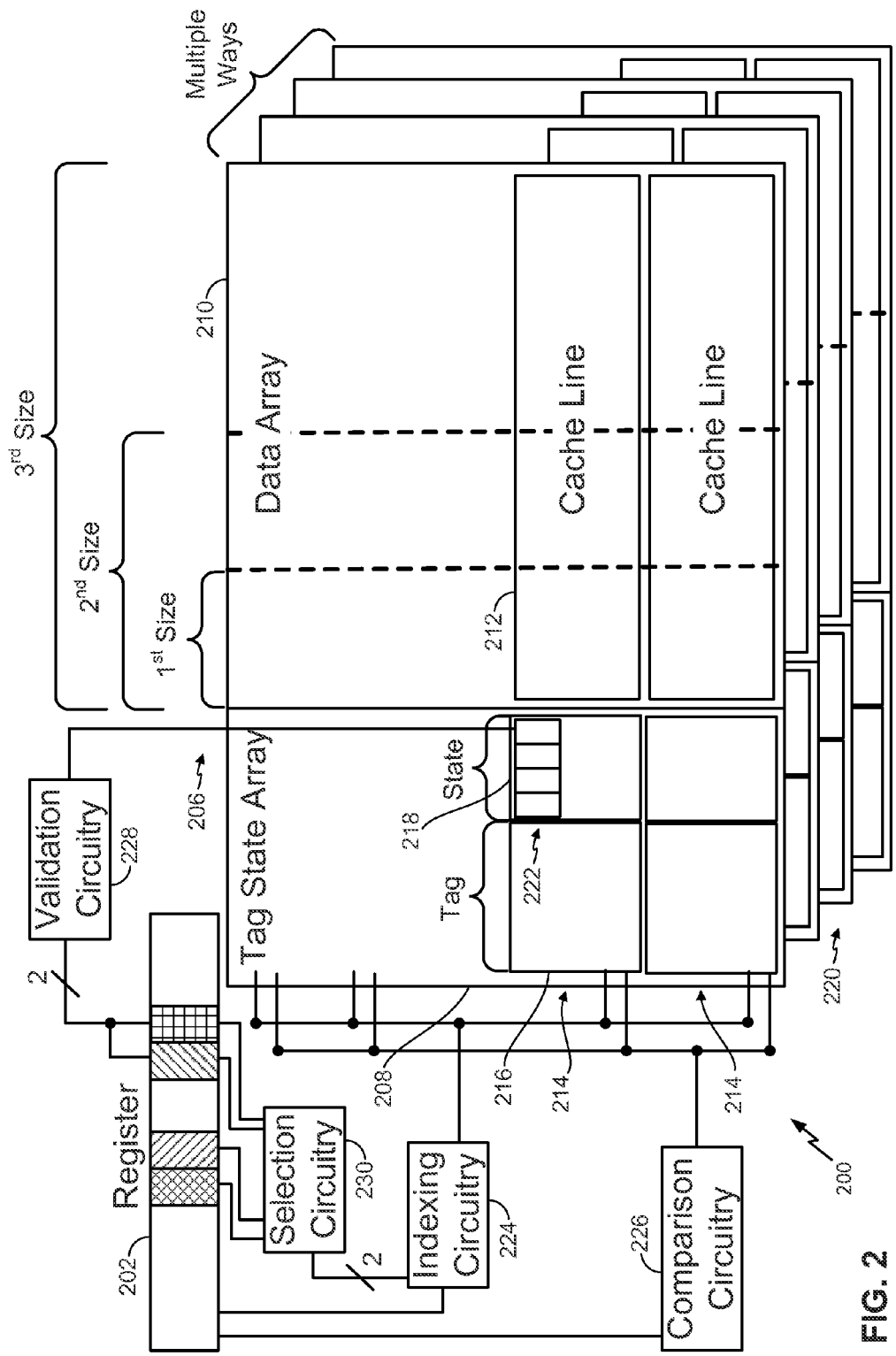
FIG. 2 is a block diagram of another particular illustrative embodiment of a configurable cache system having a tag state array, multiple ways, and a cache data area coupled to the tag state array.

Referring to FIG. 2, a particular illustrative embodiment of a configurable cache system 200 having a tag state array 208, multiple ways 220, and a data area 210 coupled to the tag state array 208 is illustrated. The configurable cache system 200 includes a configurable cache 206, a memory address register 202 to store a memory address, indexing circuitry 224, comparison circuitry 226, validation circuitry 228, and selection circuitry 230. The configurable cache 206 includes the tag state array 208 coupled to the data area 210. The data area 210 includes one or more cache lines 212. The data area 210 is configurable to have a first cache size corresponding to a first cache configuration or to have a second cache size corresponding to a second cache configuration, where the second cache size is larger than the first cache size, or to have a third cache size corresponding to a third cache configuration, where the third cache size is larger than the second cache size, as shown in FIG. 2. The data area 210 includes the multiple ways 220 associated with each value of a set index. The multiple ways 220 enable the data area 210 to store multiple data values corresponding to each set index value. The data area 210 has the same number of ways 220 in the first cache configuration and in the second cache configuration and in the third cache configuration, as shown in FIG. 2.

The tag state array 208 includes a to area 216 addressable by the set index. The tag state array 208 also includes a state area 218 addressable by a state address. Each of the cache lines 212 is addressable by a tag address. The tag state array 208 also includes one or more sets 214. In a particular embodiment, the tag state array 208 may have the same size of a set 214 in the first cache configuration and in the second cache configuration and in the third cache configuration.

In a particular embodiment, the data area 210 has a predetermined number of sets to store data that is accessible via the set index and the tag state array 208. In a first cache configuration, each of the predetermined number of sets of the data area 210 may be configured to store a first amount of data. In a second cache configuration, each of the predetermined number of sets of the data area 210 may be configured to store a second amount of data.

In a particular embodiment, the indexing circuitry 224 is coupled to the memory address register 202 to identify multiple tag entries of the tag state array 208 using the set index. For example, the indexing circuitry 224 may access the tag state array 208 and locate and identify multiple tag entries corresponding to the set index received from the memory address register 202. The indexing circuitry may also be coupled to the selection circuitry by a two-bit connection, as shown in FIG. 2.

In a particular embodiment, the comparison circuitry 226 is coupled to the memory address register 202 to compare a tag value of the identified multiple tag entries to a tag portion of the memory address. For example, the comparison circuitry 226 may access the tag state array 208 and compare the tag values of the multiple tag entries identified by the indexing circuitry 224 to respective tag portions of the memory address received from the memory address register 202.

In a particular embodiment, the validation circuitry 228 is coupled to the memory address register 202 to decode the state address and to compare the decoded state address to validation bits 222 of an identified set of the predetermined number of sets of the data area 210. The validation circuitry 228 may access the tag state array 208 and compare the validation bits 222 to the decoded state address portion of the memory address received from the memory address register 202. The validation circuitry 228 may be coupled to the memory address register 202 by a two-bit connection, as shown in FIG. 2. The validation bits 222 may include 4 state bits, as shown in FIG. 2.

In a particular embodiment, the selection circuitry 230 is coupled to the memory address register 202 and to the indexing circuitry 224 to selectively include a particular bit of the memory address in the set index in the first cache configuration and to not include the particular bit in the set index in the second cache configuration, as will be described in more detail below in connection with FIG. 4. The selection circuitry 230 may be coupled to the indexing circuitry 224 by a two-bit connection, as shown in FIG. 2. In a particular embodiment, the selection circuitry 230 includes a multiplexer, such as multiplexer 406 shown in FIG. 4, having an input coupled to receive at least one common bit, as shown at 424 in FIG. 4, and having an output coupled to the tag area 216, as shown at 416 in FIG. 4. The multiplexer may be configured to selectively provide the at least one common bit as a selectable input to the set index, such as set index 408 shown in FIG. 4.

Figure 3:
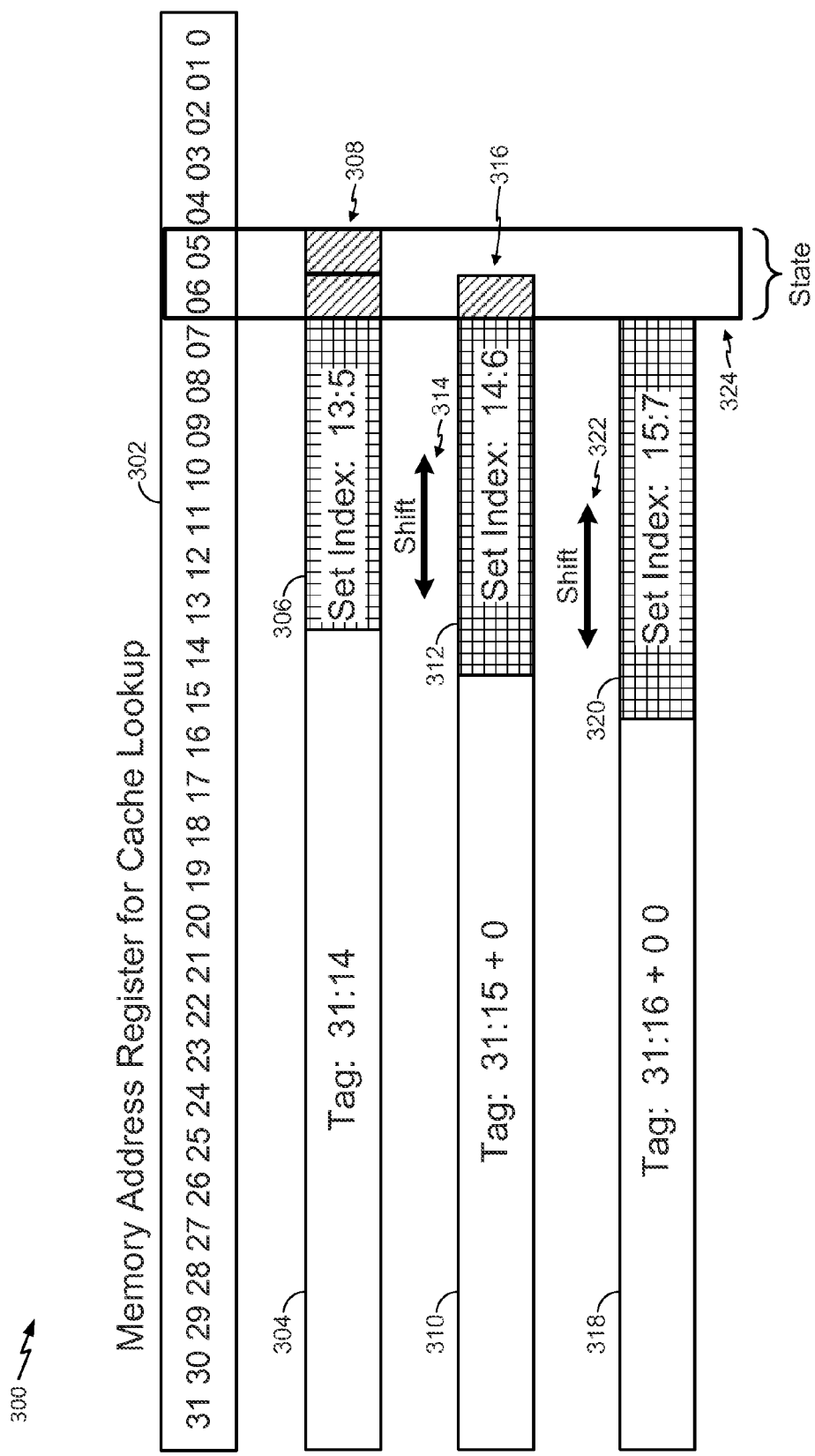
FIG. 3 is a block diagram of a particular illustrative embodiment of a memory address register for cache lookup and a shifting set index.

Referring to FIG. 3, a particular illustrative embodiment of a memory address register for cache lookup 302 and a shifting set index 306, 312, 320 is shown at 300. The shifting set index 306, 312, and 320 enables addressing into the cache using the same number of sets for three different cache size configurations. In a particular embodiment, the memory address register for cache lookup 302 is the address 102 of FIG. 1 or the memory address register 202, of FIG. 2.

The set index 306 ranges over 9 bits from bit 13 to bit 5, sharing two common bits 308 (bit 5 and bit 6) with a state portion 324 of the address, where the state portion 324 ranges over two bits from bit 6 to bit 5. A tag portion 304 of the address ranges from bit 31 to bit 14.

Shifting with a 1-bit shift, as indicated by the arrow 314, gives the set index 312, which ranges over 9 bits from bit 14 to bit 6, sharing one common bit 316 (bit 6) with the state portion 324 of the address. In this case, bit 5 of the state portion 324 of the address may be used to label two cache line segments or sectors, so that the cache having the set index 312 may be twice as big as the cache having the set index 306. A tag portion 310 of the address ranges from bit 31 to bit 15, with an added least significant bit of zero that may be concatenated to bits 31:15.

Shifting with another shift, as indicated by the arrow 322, gives the set index 320, which ranges over 9 bits from bit 15 to bit 7, sharing no common bits with the state portion 324 of the address. In this case, both bit 5 and bit 6 of the state portion 324 of the address may be used to label four cache line segments or sectors, so that the cache having the set index 320 may be twice as big as the cache having the set index 312. A tag portion 318 of the address ranges from bit 31 to bit 16, with two least significant bits of zeroes added that may be concatenated to bits 31:16.

The total cache size may be given by the product of the number of sets times the number of ways times the cache line size times the number of segments or sectors. The number of sets indexed by a 9-bit set index is $2^9=512$. For a 4-way cache having a cache line size of 32 bits, the total cache size is 512 times 4 times 32 or about 64 kilobits (kbit) for the cache having the set index 306, where the cache has only one segment or sector for each cache line. For the cache having the set index 312, where the cache has two segments or sectors for each cache line, the total cache size is about 128 kbit. For the cache having the set index 320, where the cache has four segments or sectors for each cache line, the total cache size is about 256 kbit.

Figure 4:
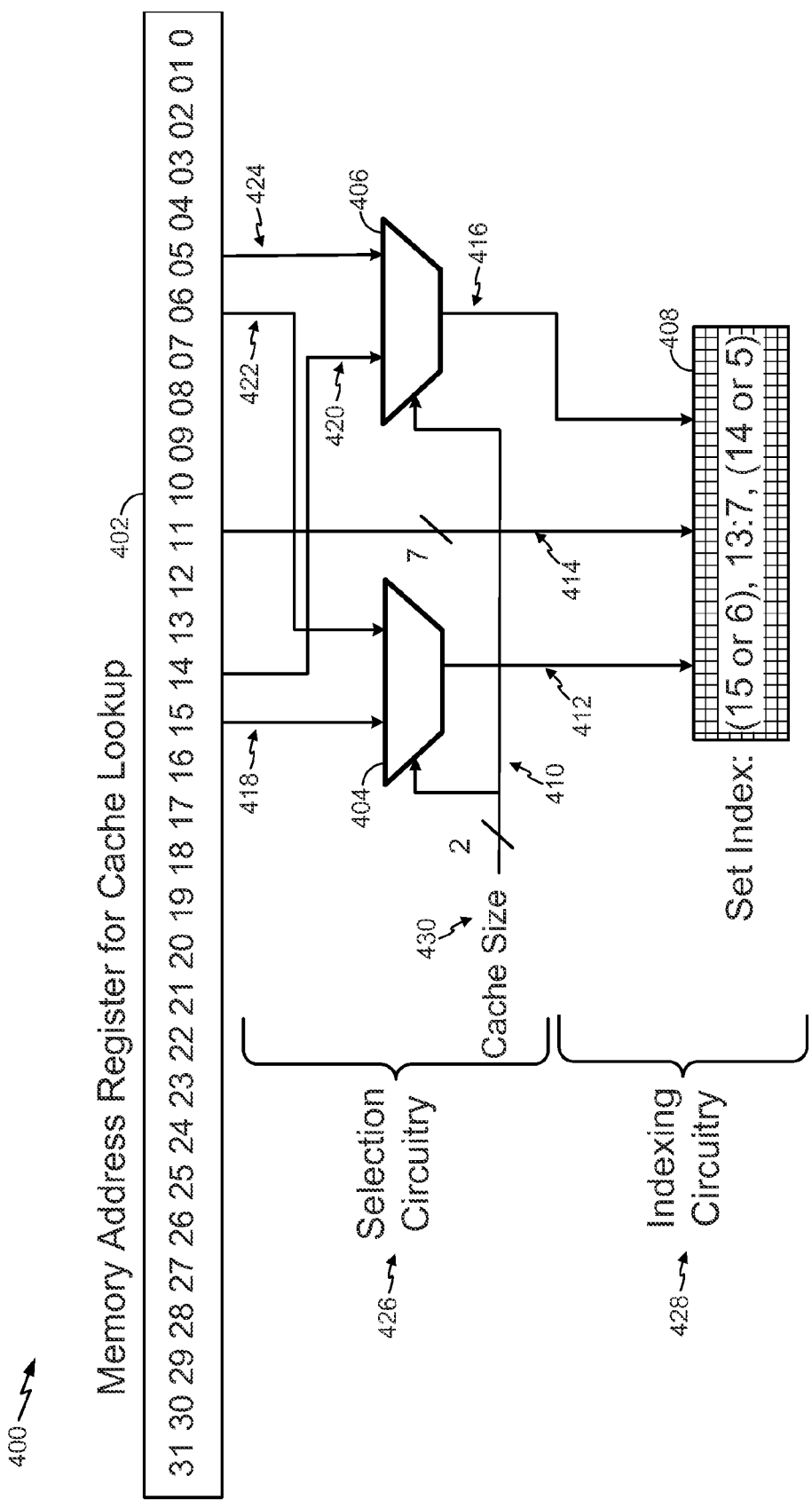
FIG. 4 is a block diagram of a particular illustrative embodiment of a memory address register for cache lookup and selection circuitry and indexing circuitry used to generate a set index.

Referring to FIG. 4, a particular illustrative embodiment of a memory address register for cache lookup 402 and selection circuitry 426 and indexing circuitry 428 used to generate a set index 408 is shown at 400. The system 400 can be used to determine the shifting set index 306, 312, 320 of the register system 300 of FIG. 3. The system 400 may be implemented in the configurable cache system 100 of FIG. 1 or the configurable cache system 200 of FIG. 2.

The memory address register for cache lookup 402 is configured to store 32 bit values, labeled from a least significant bit (LSB), bit 0, to a most significant bit (MSB), bit 31. A multiplexer 404 receives bit 15 from the memory address register for cache lookup 402 as one input, as indicated at 418, and bit 6 as another input, as indicated at 422. The multiplexer 404 outputs either bit 15 or bit 6 to the set index 408, as indicated at 412. The output of the multiplexer 401 is controlled by a cache size 430 control along a two-bit line 410. A multiplexer 406 receives bit 14 as one input, as indicated at 420, and bit 5 as another input, as indicated at 421. The multiplexer 406 outputs either bit 14 or bit 5 to the set index 408, as indicated at 416. The output of the multiplexer 406 is controlled by the cache size 430 control along the two-bit line 410. The set index 408 receives bits from the memory address register for cache lookup 402 ranging from bit 13 to bit 7 along a 7-bit line 414.

When the multiplexer 404 outputs bit 6 and the multiplexer 406 outputs bit 5, then the set index 408 corresponds to the set index 306 of FIG. 3. When the multiplexer 404 outputs bit 6 and the multiplexer 406 outputs bit 14, then the set index 408 corresponds to the set index 312 of FIG. 3, where the cache having the set index 312 may be twice the size of the cache having the set index 306. When the multiplexer 404 outputs bit 15 and the multiplexer 406 outputs bit 14, then the set index 408 corresponds to the set index 320 of FIG. 3, where the cache having the set index 320 may be twice the size of the cache having the set index 312 and may be four times the size of the cache having the set index 306.

Figure 5:
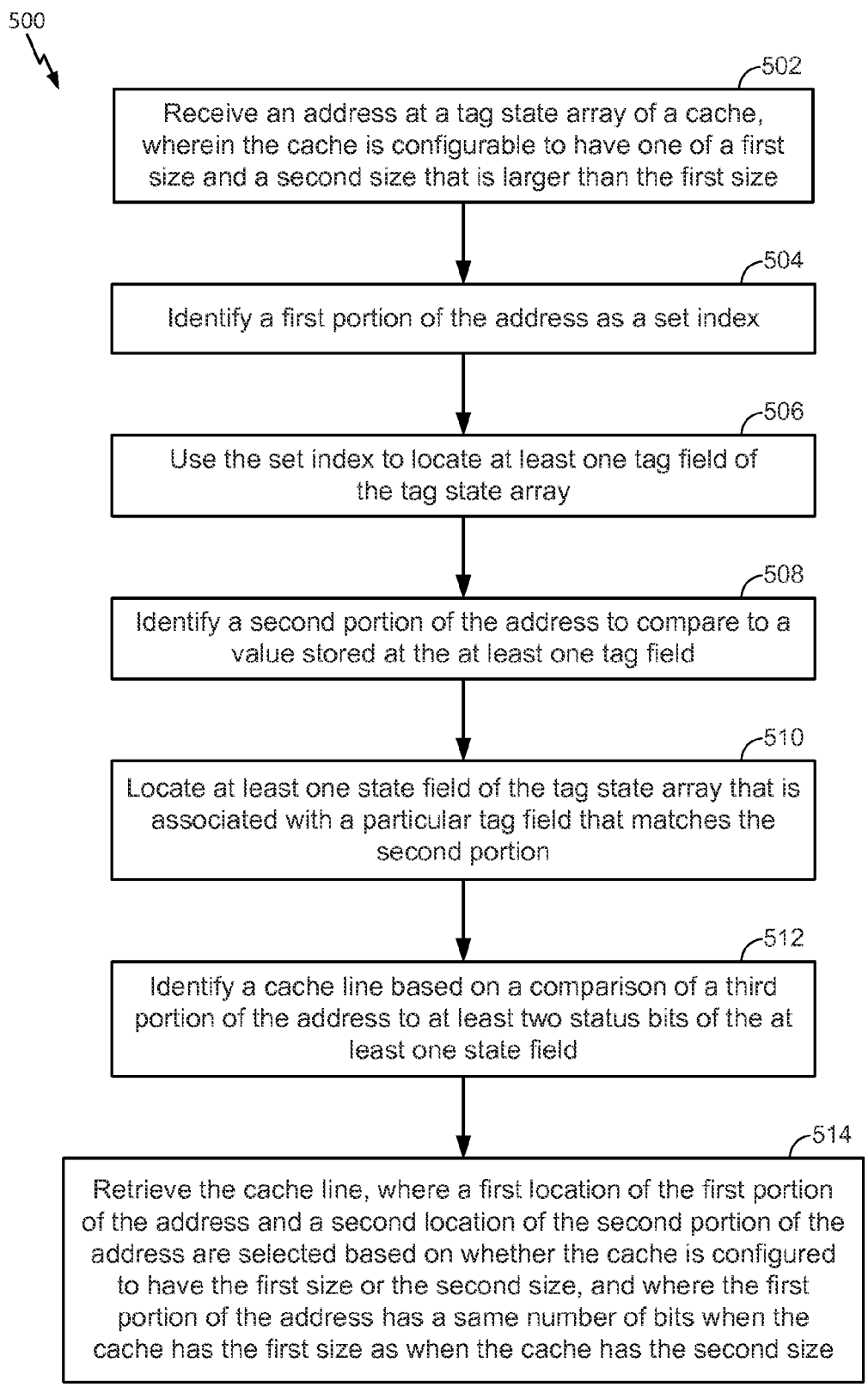
FIG. 5 is a flow diagram of a first illustrative embodiment of a method to configure a configurable cache.

Referring to FIG. 5, a flow diagram of a first illustrative embodiment of a method to configure a configurable cache is shown at 500. The method 500 includes receiving an address at a tag state array of a cache, where the cache is configurable to have one of a first size and a second size that is larger than the first size, at 502. For example, the address 102 may be received at the tag state array 108 of the configurable cache 106, where the cache data area 110 of the configurable cache 106 is configurable to have one of the first size and the second size that is larger than the first size, as shown in FIG. 1. The method 500 also includes identifying a first portion of the address as a set index, at 504. For example, a first portion of the address 102 may be identified as the set index 1 122 or a first portion of the address 102 may be identified as the set index 2 124, as shown in FIG. 1. Similarly, a first portion of the address in the memory address register for cache lookup 302 may be identified as the set index 306, or as the set index 312, or as the set index 320, as shown in FIG. 3.

The method 500 further includes using the set index to locate at least one tag field of the tag state array, at 506. For example, either the set index 1 122 or the set index 2 124 may be used to locate at least one tag area 116 of the tag state array 108 shown in FIG. 1. The method 500 also includes identifying a second portion of the address to compare to a value stored at the at least one tag field, at 508. For example, a second portion of the address 102 may be identified as the tag 128 that may be compared to a value stored at the at least one tag area 116 of FIG. 1. The method 500 further includes locating at least one state field of the tag state array that is associated with a particular tag field that matches the second portion, at 510. For example, at least one state area 118 of the tag state array 108 may be located that may be associated with a particular tag area 116 that matches the tag 128 of FIG. 1.

The method 500 also includes identifying a cache line based on a comparison of a third portion of the address to at least two status bits of the at least one state field, at 512. For example, one of the cache lines 112 may be identified based on a comparison of the state address 126 portion of the address 102 to at least two status bits of the at least one state area 118 of the tag state array 108 of FIG. 1. The method 500 further includes retrieving the cache line, at 514, where a first location of the first portion of the address and a second location of the second portion of the address are selected based on whether the cache is configured to have the first size or the second size and where the first portion of the address has a same number of bits when the cache has the first size as when the cache has the second size. For example, the identified one of the cache lines 112 may be retrieved, where a first location of the set index portion (the set index 1 122 or the set index 2 124) of the address 102 and a second location of the tag 128 portion of the address 102 may be selected based on whether the cache data area 110 is configured to have the first size or the second size and where the set index portion (the set index 1 122 or the set index 2 124) of the address 102 has the same number of bits when the cache data area 110 has the first size as when the cache data area 110 has the second size.

In a particular embodiment, the cache is further configurable to have a third size that is larger than the second size. For example, the data area 210 of the configurable cache 206 may be further configurable to have a third size that is larger than the second size, as shown in FIG. 2. In a particular embodiment, the first portion of the address overlaps two bits of the third portion of the address when the cache is configured to have the first size, where the first portion of the address overlaps a single bit of the third portion of the address when the cache is configured to have the second size, and where the first portion of the address does not overlap any bits of the third portion of the address when the cache is configured to have the third size. For example, as described above, the set index 306 of FIG. 3 overlaps two bits 308 of the state address 324 when the cache is configured to have the first size (64 kbit), where the set index 312 overlaps a single bit 316 of the state address 324 when the cache is configured to have the second size (128 kbit), and where the set index 320 does not overlap any bits of the state address 324 when the cache is configured to have the third size (256 kbit).

Figure 6:
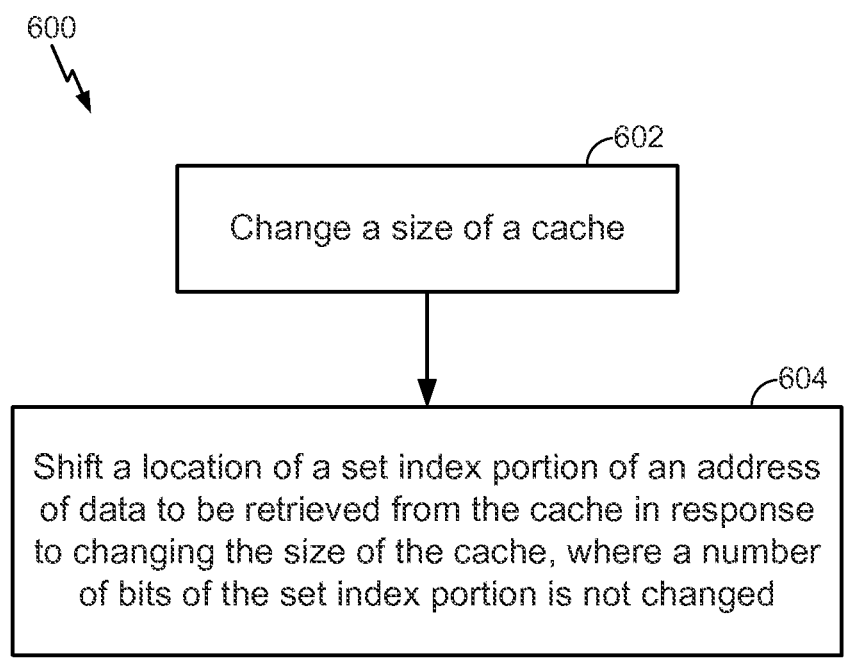
FIG. 6 is a flow diagram of a second illustrative embodiment of a method to configure a configurable cache.

Referring to FIG. 6, a flow diagram of a second illustrative embodiment of a method to configure a configurable cache is shown at 600. The method 600 includes changing a size of a cache, at 602. For example, the cache data area 110 of the configurable cache 106 of FIG. 1 may be changed from the first size to the second size, or from the second size to the first size. Similarly, the data area 210 of the configurable cache 206 of FIG. 2 may be changed from the first size to the second size, or from the second size to the third size, or from the first size to the third size, or from the second size to the first size, or from the third size to the second size, or from the third size to the first size.

The method 600 also includes shifting a location of a set index portion of an address of data to be retrieved from the cache in response to changing the size of the cache, where a bit length of the set index portion is not changed when the location is shifted, at 604. For example, the set index 306 of FIG. 3 may be shifted as shown by the arrow 314 to the location of the set index 312 in response to changing the size of the cache from 64 kbit to 128 kbit, where both the set index 306 and the set index 312 have a bit length of 9 bits. Similarly, the set index 312 of FIG. 3 may be shifted as shown by the arrow 322 to the location of the set index 320 in response to changing the size of the cache from 128 kbit to 256 kbit, where both the set index 312 and the set index 320 have a bit length of 9 bits.

In a particular embodiment, the set index portion of the address overlaps at least one bit of a state address portion of the address when the cache is configured to have a first size or when the cache is configured to have a second size that is larger than the first size. For example, the set index 306 of FIG. 3 overlaps at least one bit 308 of the state address 324 when the cache is configured to have a first size of about 64 kbit and the set index 312 overlaps at least one bit 316 of the state address 324 when the cache is configured to have a second size of about 128 kbit.

In a particular embodiment, the cache is further configurable to have a third size that is larger than the second size. For example, the data area 210 of the configurable cache 206 may be further configurable to have a third size that is larger than the second size, as shown in FIG. 2. In a particular embodiment, the set index portion of the address overlaps two bits of the state address portion of the address when the cache is configured to have the first size, where the set index portion of the address overlaps a single bit of the state address portion of the address when the cache is configured to have the second size, and where the set index portion of the address does not overlap any bits of the state address portion of the address when the cache is configured to have the third size. For example, as described above, the set index 306 of FIG. 3 overlaps two bits 308 of the state address 324 when the cache is configured to have the first size (64 kbit), where the set index 312 overlaps a single bit 316 of the state address 324 when the cache is configured to have the second size (128 kbit), and where the set index 320 does not overlap any bits of the state address 324 when the cache is configured to have the third size (256 kbit).

Figure 7:
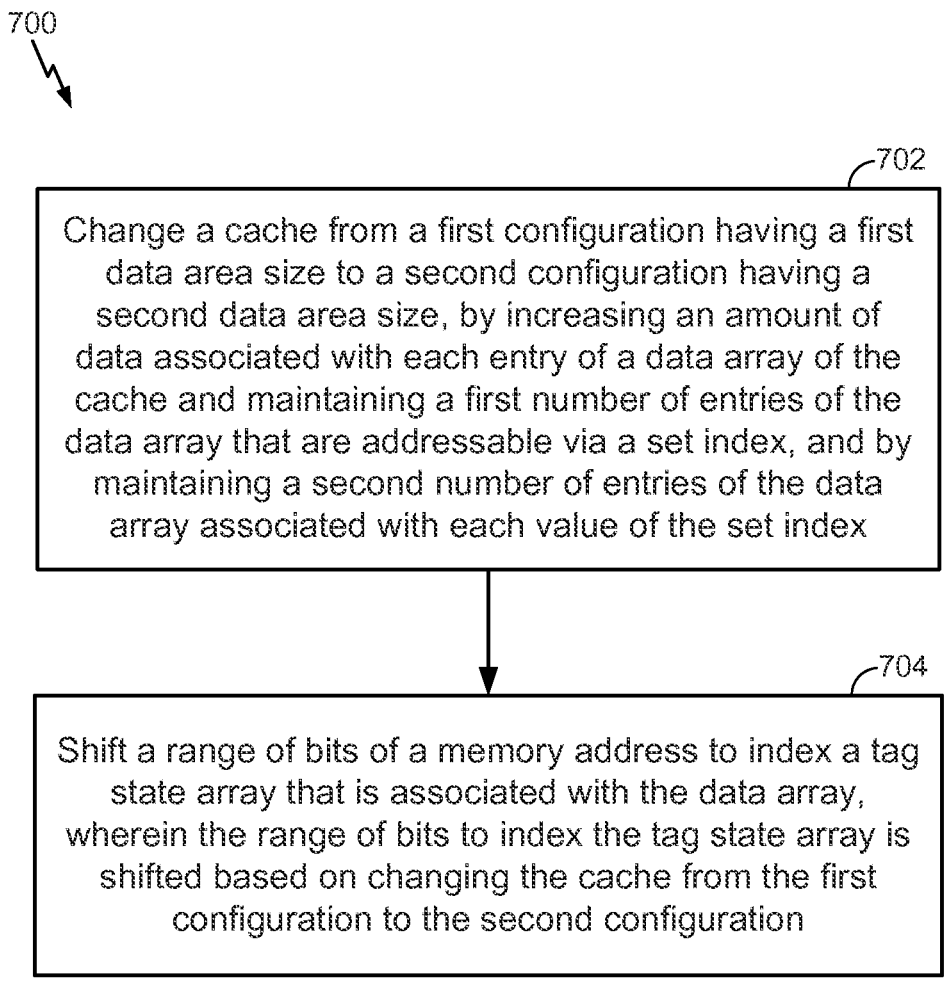
FIG. 7 is a flow diagram of a third illustrative embodiment of a method to configure a configurable cache.

Referring to FIG. 7, a flow diagram of a third illustrative embodiment of a method to configure a configurable cache is shown at 700. The method 700 includes changing a cache from a first configuration having a first data area size to a second configuration having a second data area size, by increasing an amount of data associated with each entry of a data array of the cache and maintaining a first number of entries of the data array that are addressable via a set index, and by maintaining a second number of entries of the data array associated with each value of the set index, at 702. For example, the configurable cache 106 of FIG. 1 may have the cache data area 110 change from the first size to the second size by adding the cache line sectors or segments 112b to the cache line sectors or segments 112a of each of the cache lines 112.

The method 700 also includes shifting a range of bits of a memory address to index a tag state array that is associated with the data array, where the range of bits to index the tag state array is shifted based on changing the cache from the first configuration to the second configuration, at 704. For example, the set index 306 of FIG. 3 may be shifted as shown by the arrow 314 to the location of the set index 312 in response to changing the size of the cache from 64 kbit to 128 kbit, where both the set index 306 and the set index 312 index a tag state array that is associated with a data array, such as the tag state array 108 of FIG. 1 that is associated with the cache data area 110.

In a particular embodiment, the method 700 further includes setting control inputs to a pair of multiplexers that each receive at least one input from the range of bits to index the tag state array and that each output a selectable bit to the set index. For example, the multiplexer 404 of FIG. 4 and the multiplexer 406 may have their respective control inputs set by the cache size 430 control along the two-bit line 410. As described above, the multiplexer 404 and the multiplexer 406 may each receive at least one input from a range of bits to index a tag state array, such as the tag state array 108 of FIG. 1 or the tag state array 208 of FIG. 2, and may each output a selectable bit to the set index 408.

In a particular embodiment, the method 700 further includes changing the cache from the second configuration having the second data area size to a third configuration having a third data area size, by increasing the amount of data associated with each entry of a data array of the cache and maintaining the first number of entries of the data array that are addressable via the set index, and by maintaining the second number of entries of the data array associated with each value of the set index. For example, the configurable cache 206 of FIG. 2 may have the data area 210 change from the second size to the third size by adding additional cache line sectors or segments to the existing cache line sectors or segments of each of the cache lines 212. The method 700 may further include shifting the range of bits of the memory address to index the tag state array that is associated with the data array, where the range of bits to index the tag state array is shifted in response to changing the cache from the second configuration to the third configuration. For example, the set index 312 of FIG. 3 may be shifted as shown by the arrow 322 to the location of the set index 320 in response to changing the size of the cache from 128 kbit to 256 kbit, where both the set index 312 and the set index 320 index a tag state array that is associated with a data array, such as the tag state array 208 of FIG. 2 that is associated with the data area 210.

A configurable cache operating in accordance with the methods of FIGS. 5-7 or in accordance with other embodiments described herein may be incorporated in a variety of electronic devices, such as a mobile phone, a set-top box device, a computer, a personal digital assistant (PDA), a music player, a video player, any other device that stores or retrieves data or computer instructions, or any combination thereof.

Figure 8:
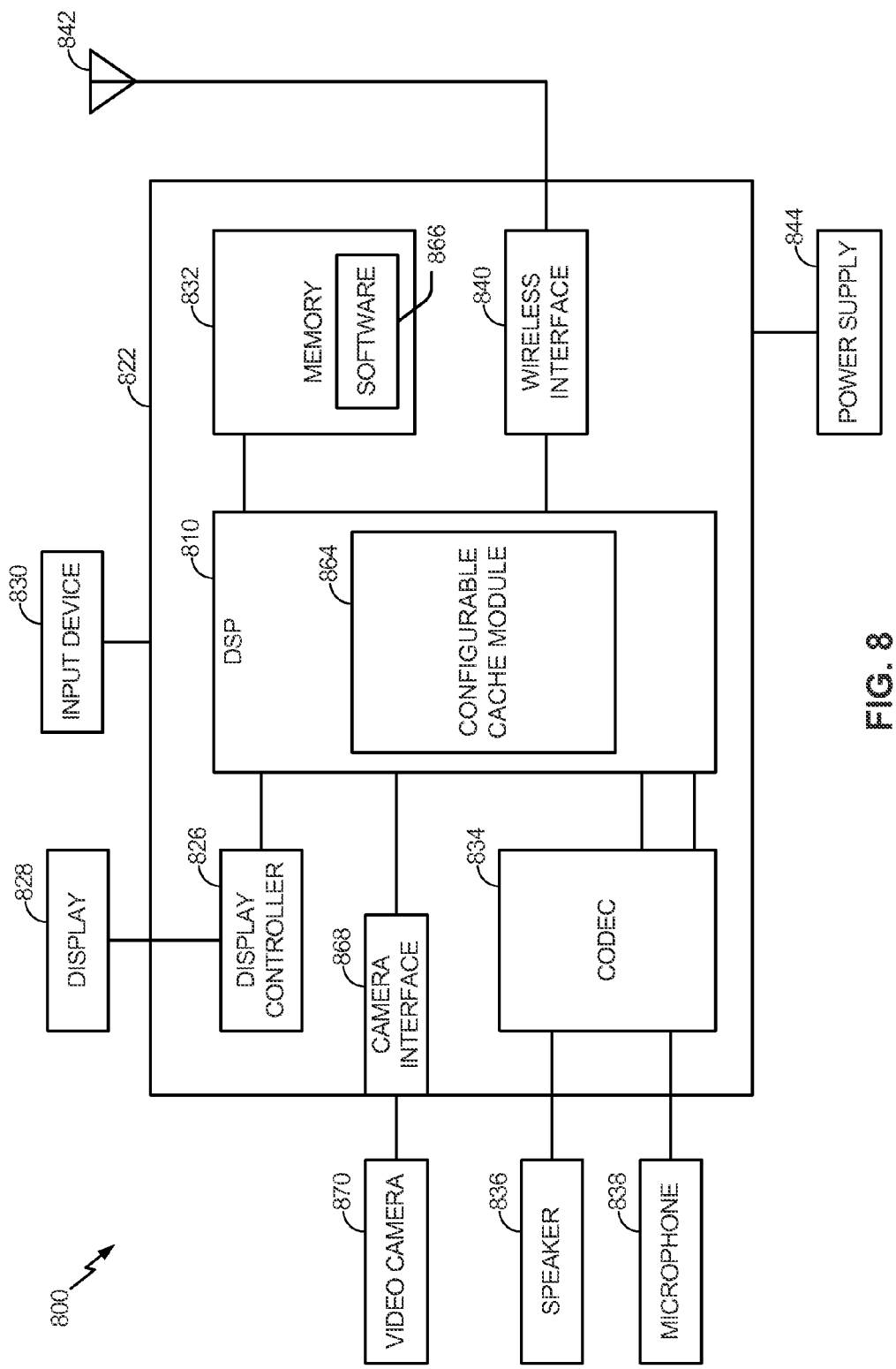
FIG. 8 is a block diagram of a particular embodiment of a portable communication device including a configurable cache module.

FIG. 8 is a block diagram of particular embodiment of a system 800 including a configurable cache module 864. The system 800 may be implemented in a portable electronic device and includes a signal processor 810, such as a digital signal processor (DSP), coupled to a memory 832. The system 800 includes the configurable cache module 864. In an illustrative example, the configurable cache module 864 includes any of the systems of FIGS. 1-4, operates in accordance with any of the embodiments of FIGS. 5-7, or any combination thereof. The configurable cache module 864 may be in the signal processor 810 or may be a separate device or circuitry (not shown). In a particular embodiment, the configurable cache 106 of FIG. 1 is accessible to a digital signal processor. For example, as shown in FIG. 8, the configurable cache module 864 is accessible to the digital signal processor (DSP) 810 and the digital signal processor 810 is configured to access data or program instructions stored at the configurable cache module 864. The at least one common bit 104 of FIG. 1 may correspond to a predetermined bit of a memory address, such as the address 102, that is received at the configurable cache 106 in conjunction with a cache lookup operation performed at the digital signal processor 810.

A camera interface 868 is coupled to the signal processor 810 and also coupled to a camera, such as a video camera 870. A display controller 826 is coupled to the signal processor 810 and to a display device 828. A coder/decoder (CODEC)

834 can also be coupled to the signal processor 810. A speaker 836 and a microphone 838 can be coupled to the CODEC 834. A wireless interface 840 can be coupled to the signal processor 810 and to a wireless antenna 842 such that wireless data received via the antenna 842 and wireless interface 840 can be provided to the processor 810.

The signal processor 810 may be configured to execute computer executable instructions 866 stored at a computer-readable medium, such as the memory 832, that are executable to cause a computer, such as the processor 810, to cause the configurable cache module 864 to change a cache from a first configuration having a first data area size to a second configuration having a second data area size, by increasing an amount of data associated with each entry of a data array of the cache and maintaining a first number of entries of the data array that are addressable via a set index, and by maintaining a second number of entries of the data array associated with each value of the set index. The computer executable instructions are further executable to cause the configurable cache module 864 to shift a range of bits of a memory address to index a tag state array that is associated with the data array, where the range of bits to index the tag state array is shifted based on changing the cache from the first configuration to the second configuration.

In a particular embodiment, the signal processor 810, the display controller 826, the memory 832, the CODEC 834, the wireless interface 840, and the camera interface 868 are included in a system-in-package or system-on-chip device 822. In a particular embodiment, an input device 830 and a power supply 844 are coupled to the system-on-chip device 822. Moreover, in a particular embodiment, as illustrated in FIG. 8, the display device 828, the input device 830, the speaker 836, the microphone 838, the wireless antenna 842, the video camera 870, and the power supply 844 are external to the system-on-chip device 822. However, each of the display device 828, the input device 830, the speaker 836, the microphone 838, the wireless antenna 842, the video camera 870, and the power supply 844 can be coupled to a component of the system-on-chip device 822, such as an interface or a controller.

Figure 9:
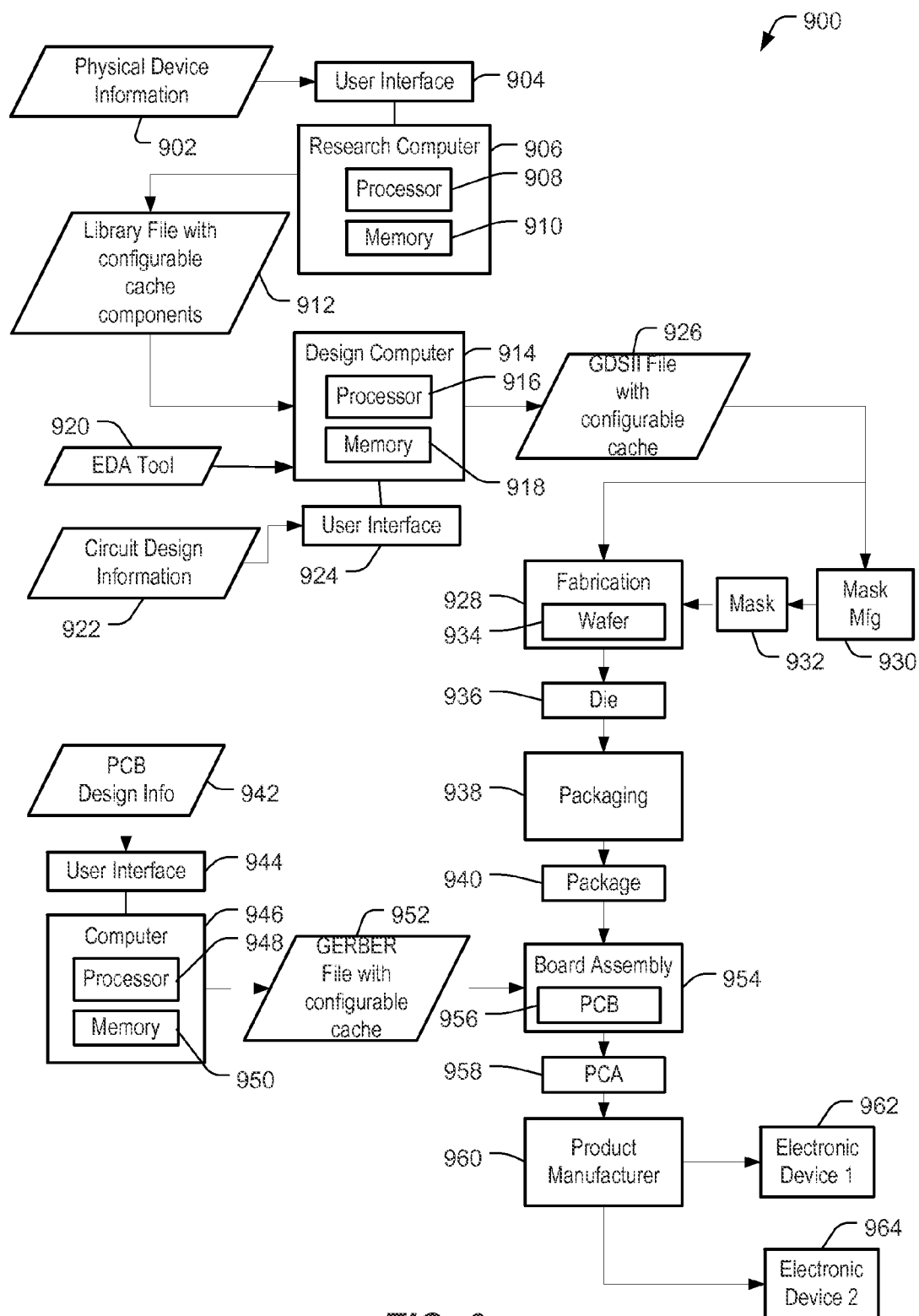
FIG. 9 is a data flow diagram of a particular illustrative embodiment of a manufacturing process to manufacture electronic devices that include configurable cache devices.

The foregoing disclosed devices and functionalities may be implemented by providing design information and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 9 depicts a particular illustrative; embodiment of an electronic device manufacturing process 900.

Physical device information 902 is received in the manufacturing process 900, such as at a research computer 906. The physical device information 902 may include design information representing at least one physical property of a semiconductor device, such as the components of the configurable cache of FIG. 1, the components of the configurable cache of FIG. 2, or any combination thereof. For example the physical device information 902 may include physical parameters, material characteristics, and structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of data files corresponding to semiconductor devices including the components of the configurable cache of FIG. 1, the components of the configurable cache of FIG. 2, or any combination thereof, that is provided for use with an electronic design automation (FDA) tool 920.

The library file 912 may be used in conjunction with the EDA tool 920 at a design computer 914 that includes a processor 916, such as one or more processing cores, coupled to a memory 918. The FDA tool 920 may be stored as processor executable instructions at the memory 918 to enable a user of the design computer 914 to design a circuit using the components of the configurable cache of FIG. 1, the components of the configurable cache of FIG. 2, or any combination thereof, of the library file 912. For example, a user of the design computer 914 may enter circuit design information 922 via a user interface 924 coupled to the design computer 914. The circuit design information 922 may include design information representing at least one physical property of a semiconductor device, such as the components of the configurable cache of FIG. 1, the components of the configurable cache of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 9 may be configured to transform the design information, including the circuit design information 922, to comply with a file format. To illustrate, the file format may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the configurable cache of FIG. 1, the configurable cache of FIG. 2, or any combination thereof, in addition to other circuits or information. To illustrate, the data file may include information corresponding to a system-on-chip (SOC) that includes the configurable cache of FIG. 1 and that also includes additional electronic circuits and components within the SOC.

The GDSII file 926 may be received at a fabrication process 928 to manufacture the configurable cache of FIG. 1, the configurable cache of FIG. 2, the SOC, or any combination thereof, according to transformed information in the GDSII file 926. For example, a device manufacture process may include providing the GDSII file 926 to a mask manufacturer 930 to create one or more masks, such as masks to be used for photolithography processing, illustrated as a representative mask 932. The mask 932 may be used during the fabrication process to generate one or more wafers 934, that may be tested and separated into dies, such as a representative die 936. The die 936 includes a circuit including the configurable cache of FIG. 1, the configurable cache of FIG. 2, or any combination thereof.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the configurable cache of FIG. 1, the configurable cache of FIG. 2, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the configurable cache of FIG. 1, the configurable cache of FIG. 2, or any combination thereof. In other embodiments, the data file generated by the transformed PCB design information may have a format other than a GERBER format.

The GERBER file 952 may be received at a board assembly process 954 and used to create PCBs, such as a representative PCB 956, that are manufactured in accordance with the design information stored within the GERBER file 952. For example, the GERBER file 952 may be uploaded to one or more machines for performing various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 962 and 964 may be remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-8 may illustrate remote units according to the teachings of the disclosure, the disclosure is not limited to these exemplary illustrated units. Embodiments of the disclosure may be suitably employed in any device that includes active integrated circuitry including memory and on-chip circuitry.

Thus, the configurable cache of FIG. 1, the configurable cache of FIG. 2, or any combination thereof, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments, such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity, or by one or more entities performing various stages of the process 900.

Those of skill would further appreciate that the various illustrative logical blocks, configurations, modules, circuits, and algorithm steps described in connection with the embodiments disclosed herein may be implemented as electronic hardware or computer software implemented via electronic hardware (e.g., a processor configured to execute instructions stored in a computer storage device). To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disk read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method comprising:
receiving an address at a tag state array of a cache, wherein the cache is configurable to have a first size, a second size that is larger than the first size, or a third size that is larger than the second size;
identifying a first portion of the address as a set index;
using the set index to locate at least one tag field of the tag state array;
identifying a second portion of the address to compare to a value stored at the at least one tag field;
locating at least one state field of the tag state array that is associated with a particular tag field that matches the second portion;
identifying a cache line based on a comparison of a third portion of the address to at least two status bits of the at least one state field, wherein a number of bits of the third portion of the address that are overlapped by the first portion of the address is based on a size of the cache; and
retrieving the cache line.

2. The method of claim 1, wherein the first portion of the address overlaps two bits of the third portion of the address when the cache is configured to have the first size, wherein the first portion of the address overlaps a single bit of the third portion of the address when the cache is configured to have the second size, and wherein the first portion of the address does not overlap any bits of the third portion of the address when the cache is configured to have the third size.

3. The method of claim 1, wherein retrieving the cache line is performed by a processor of an electronic device.

4. The method of claim 1, wherein the first portion of the address is included in a memory address register.

5. The method of claim 1, wherein the third portion of the address is a state address portion of the address.

6. The method of claim 1, wherein the first size of the cache is 64 kilobits and the second size of the cache is 128 kilobits.

7. The method of claim 6, wherein the third size of the cache is 256 kilobits.

8. An apparatus comprising:
a cache; and
a processor coupled to the cache, the processor configured to:
receive an address at a tag state array of the cache, wherein the cache is configurable to have a first size, a second size that is larger than the first size, or a third size that is larger than the second size;
use a first portion of the address as a set index to locate at least one tag field of the tag state array;
locate at least one state field of the tag state array that is associated with a particular tag field of the at least one tag field, wherein the particular tag field matches a second portion of the address; and
retrieve a cache line based on a comparison of a third portion of the address to at least two status bits of the at least one state field, wherein a number of bits of the third portion of the address that are overlapped by the first portion of the address is based on a size of the cache.

9. The apparatus of claim 8, wherein a first location of the first portion of the address and a second location of the second portion of the address are selected based on the size of the cache.

10. The apparatus of claim 9, wherein the first portion of the address has a same number of bits when the cache has the first size as when the cache has the second size.

11. The apparatus of claim 8, wherein the first portion of the address overlaps two bits of the third portion of the address when the cache is configured to have the first size.

12. The apparatus of claim 8, wherein the first portion of the address overlaps a single bit of the third portion of the address when the cache is configured to have the second size.

13. The apparatus of claim 8, wherein the first portion of the address does not overlap any bits of the third portion of the address when the cache is configured to have the third size.

14. A non-transitory computer readable medium comprising instructions that, when executed by a processor, cause the processor to:
receive an address at a tag state array of a cache, wherein the cache is configurable to have a first size, a second size that is larger than the first size, or a third size that is larger than the second size;
identify a first portion of the address as a set index;
use the set index to locate at least one tag field of the tag state array;
identify a second portion of the address to compare to a value stored at the at least one tag field;
locate at least one state field of the tag state array that is associated with a particular tag field that matches the second portion;
identify a cache line based on a comparison of a third portion of the address to at least two status bits of the at least one state field, wherein a number of bits of the third portion of the address that are overlapped by the first portion of the address is based on a size of the cache; and
retrieve the cache line.

15. The non-transitory computer readable medium of claim 14, wherein the first portion of the address overlaps two bits of the third portion of the address when the cache is configured to have the first size.

16. The non-transitory computer readable medium of claim 14, wherein the first portion of the address overlaps a single bit of the third portion of the address when the cache is configured to have the second size.

17. The non-transitory computer readable medium of claim 14, wherein the first portion of the address does not overlap any bits of the third portion of the address when the cache is configured to have the third size.

18. An apparatus comprising:
means for receiving an address at a tag state array of a cache, wherein the cache is configurable to have a first size, a second size that is larger than the first size, or a third size that is larger than the second size; and
means for identifying a first portion of the address as a set index;
means for using the set index to locate at least one tag field of the tag state array;
means for identifying a second portion of the address to compare to a value stored at the at least one tag field;
means for locating at least one state field of the tag state array, wherein the at least one state field is associated with a particular tag field that matches the second portion;
means for identifying a cache line based on a comparison of a third portion of the address to at least two status bits of the at least one state field, wherein a number of bits of the third portion of address that are overlapped by the first portion of the address is based on a size of the cache; and
means for retrieving the cache line.

19. The apparatus of claim 18, wherein the first portion of the address overlaps two bits of the third portion of the address when the cache is configured to have the first size.

20. The apparatus of claim 19, wherein the first portion of the address overlaps a single bit of the third portion of the address when the cache is configured to have the second size, and wherein the first portion of the address does not overlap any bits of the third portion of the address when the cache is configured to have the third size.

* * * * *